March 26, 1963 | J. F. BELL | 3,083,339
TURRET TUNER
Filed June 30, 1958 | 4 Sheets-Sheet 1
FIG. 1
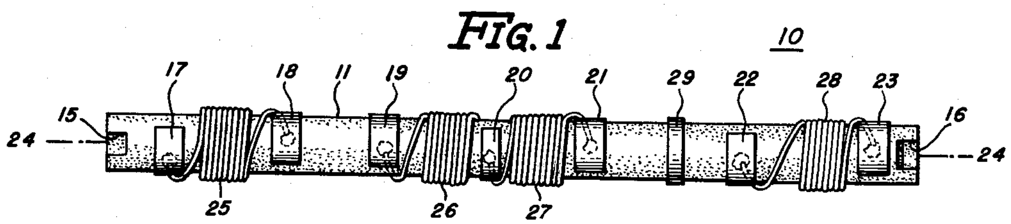
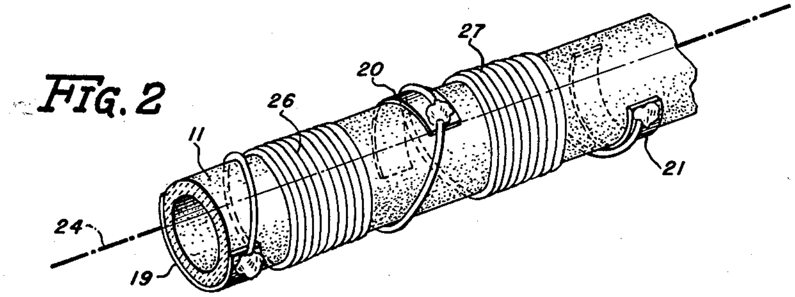
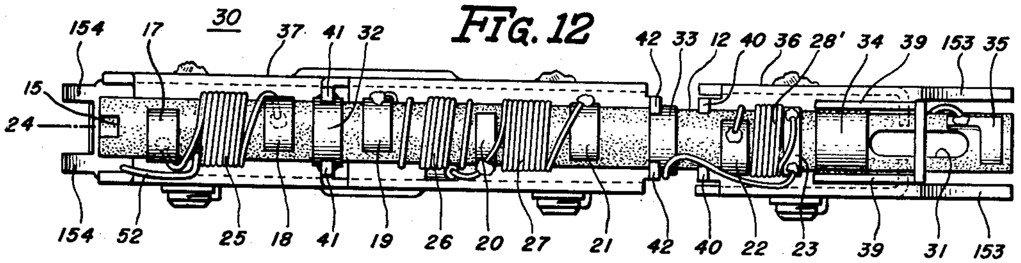
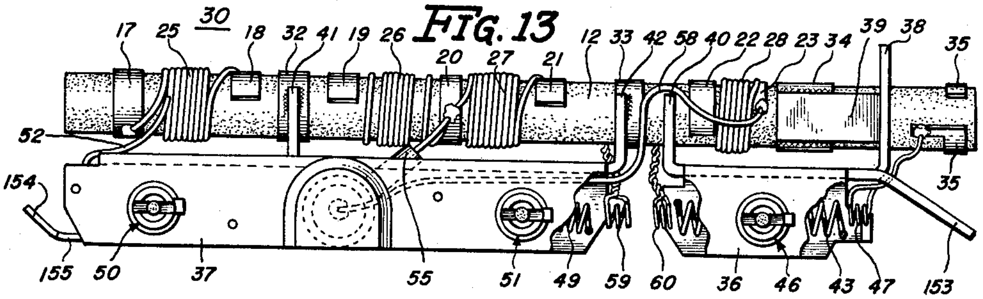
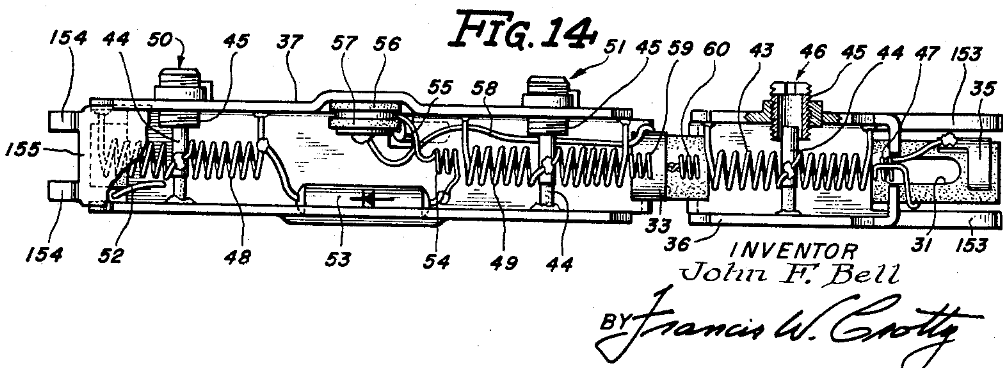
INVENTOR
John F. Bell
BY Francis W. Crotty
ATTORNEY March 26, 1963 J. F. BELL 3,083,339

TURRET TUNER

Filed June 30, 1958

4 Sheets-Sheet 2

INVENTOR
John F. Bell
BY Francis W. Crotty
ATTORNEY

March 26, 1963 J. F. BELL 3,083,339

TURRET TUNER

Filed June 30, 1958 4 Sheets-Sheet 3

INVENTOR
John F. Bell

BY Francis W. Crotty
ATTORNEY

INVENTOR
John F. Bell
BY Francis W. Crotty
ATTORNEY 3,083,339
TURRET TUNER
John F. Bell, Wilmette, Ill., assignor to Zenith Radio Corporation, a corporation of Delaware
Filed June 30, 1958, Ser. No. 745,414
10 Claims. (Cl. 325—438)

This invention relates in general to tuning mechanisms for television receivers and is particularly directed to turret tuning devices having tuning strips for selecting and translating particular television signals.

The turret tuner has been widely accepted for use in television receivers because of its inherent flexibility in comparison to other type tuning mechanisms. Briefly, turret tuner is comprised of a rotatable carriage upon which a plurality of tuning strips are demountably secured. Each strip supports frequency-selective circuit components tuned to an assigned television channel. This construction renders the circuit components of the individual strips completely independent of the circuit components associated with the other strips. Furthermore, this individualized construction permits a more attractive signal to noise figure to be realized since the input circuit components on each strip are tailored to provide the most advantageous signal-to-noise figure for its assigned channel.

Although most present-day television tuners are primarily designed for receiving transmissions from VHF stations, the flexibility of a turret mechanism is further evidenced by the fact that with a tuner of this type reception of transmissions in the UHF band may be accomplished with equal facility. It is only necessary to install on the turret a strip which has been pretuned to the desired UHF channel. One form of UHF strip for a turret tuner is described and claimed in Patent No. 2,596,117 issued to J. F. Bell et al. on May 13, 1952, and assigned to the same assignee as the present invention.

Current trends in television receivers are definitely toward compactness, and have been facilitated by miniaturization of circuit components as well as improvements in receiver tubes, e.g., the short-necked picture tube. It is highly desirable to extend this trend to the tuner art to reduce the space requirements of turret tuners while maintaining their excellent performance. A substantial portion of the cost of a turret tuner as well as its size is attributable to the individual tuning strips. These strips, as formerly constructed, comprise a panel of insulating material bearing a number of terminals and a coil form, upon which a plurality of frequency determining self-tuned or tunable inductance coils are positioned. The use of such a supporting panel in addition to the coil form makes it difficult to reduce the size of the strip materially. Moreover, this construction is more costly than desired in that it requires several independent fabricating steps such as winding the coils on the coil form and securing them thereto, assembling the coil on the panel, securing the terminals in place on the panel, and electrically connecting the coils to particular ones of the terminals. In view of the number of components as well as the numerous assembly operations entailed in fabricating these strips, it is obvious that the advantages of prior art turret tuners are not realized inexpensively.

It is therefore an object of this invention to provide a tuning strip for a turret-type tuner which is less costly than prior strips but which retains the advantages and attractive features of prior devices.

It is another object of the invention to provide a turret-type tuning mechanism featuring improved tuning strip structures and having a greatly reduced physical size.

It is another object of the invention to provide a tuning strip having a fewer number of component parts and requiring fewer assembly operations than prior devices.

It is a further object of the invention to provide an improved tuning strip construction which lends itself to automation techniques.

It is a further object of the invention to provide a turret-type tuning mechanism of improved construction characterized by the fact that the electrical parameters of the tuning strip elements, particularly coil inductances, are substantially independent of misregistration of stator and rotor contacts even during reception of UHF transmissions.

It is also an object of the invention to provide an improved method for constructing a tuning strip which avoids the multiple, time consuming and costly operations of present strip manufacturing practices.

In accordance with the invention a tuning strip for a turret tuner comprises an elongated core member of insulating material having provisions at its opposed ends for mounting the strip upon a turret. The tuning strip includes a multiplicity of conductor turns disposed upon the core member and a plurality of terminals for mechanically securing the conductor turns to the core member at a plurality of points spaced along the member. The terminals effect an electrical connection with the conductor turns at each such point to constitute therewith a plurality of coils individually provided with terminal connectors.

In one aspect of this invention the terminal connectors of each coil comprise conductive segments which are fixed to the core member in overlapping but peripherally offset spaced relation. These terminal connections are oriented with respect to one another to present contact surfaces in axial alignment along the core and the mounting provisions at one end of the core member indexes the core so as to establish a predetermined presentation of the contact surfaces of the coil terminals to stationary contacts of the turret tuner.

The invention further contemplates a method for constructing a tuning strip which entails winding a continuous conductor upon a core member in a single pass therealong to form a multiplicity of conductor turns along the core, affixing a series of terminals to the core to, in effect, arrange the conductor turns in a plurality of groups with the leading and trailing end turns of each group adjacent one of the terminals, and effecting both an electrical and a mechanical connection of each of the end turns to an associated one of the terminals so as to define a corresponding plurality of multi-turn coils.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

FIGURE 1 is a plan view of a VHF tuning strip constructed in accordance with the invention;

FIGURE 2 is a fragmentary bottom view, in perspective, of the VHF tuning strip of FIGURE 1;

Figures 3, 4, 5, 6:
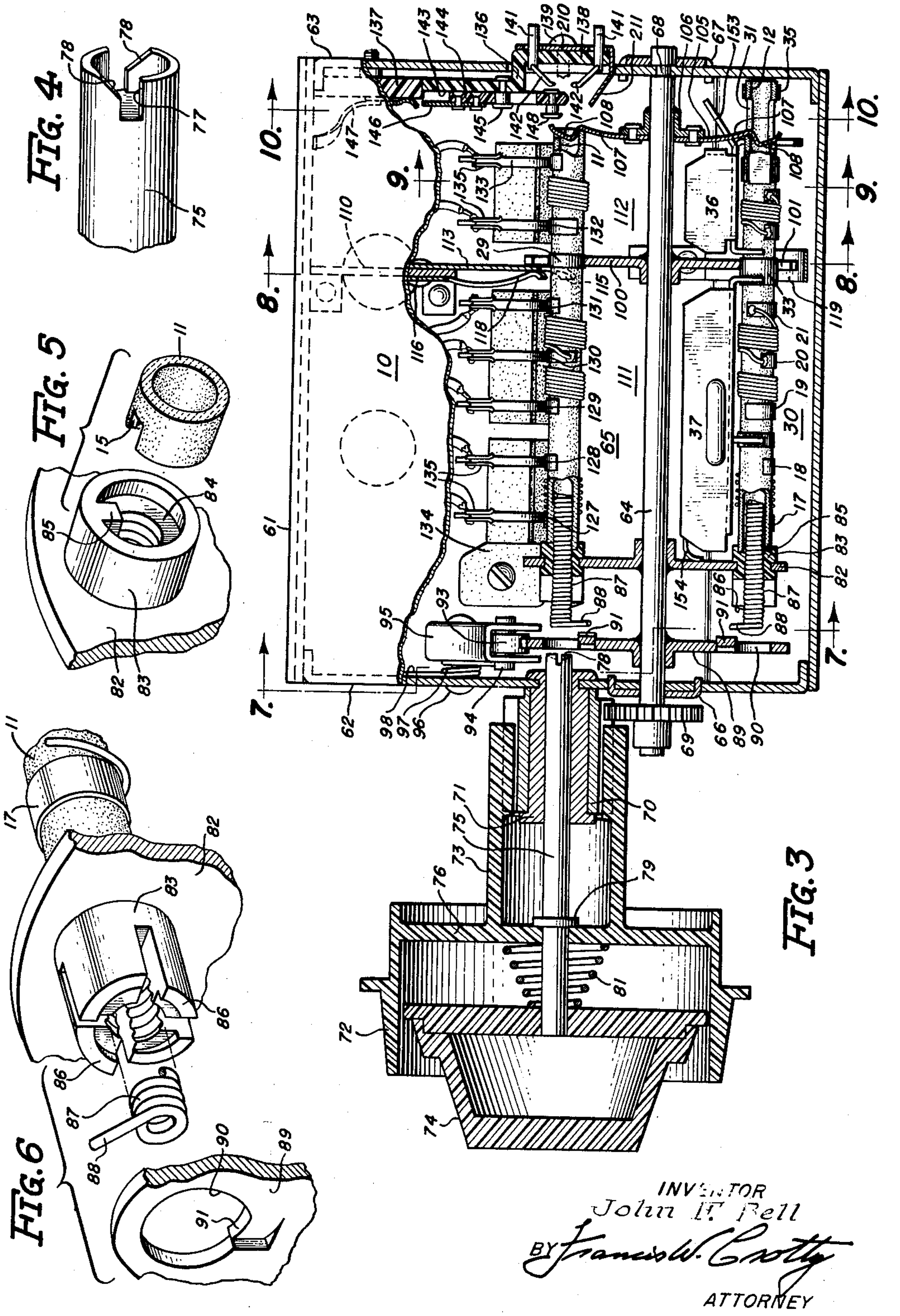
FIGURE 3 is a plan view, partly in section, of a turret type tuner embodying the subject invention.
FIGURE 4 is a fragmentary perspective view of a tuning rod for use in the turret tuner of FIGURE 3.
FIGURE 5 illustrates the indexing arrangement of a tuning strip constructed in accordance with the invention.
FIGURE 6 is an exploded view of a tuning slug arrangement for use with the tuning strip.
Figures 11, 15:
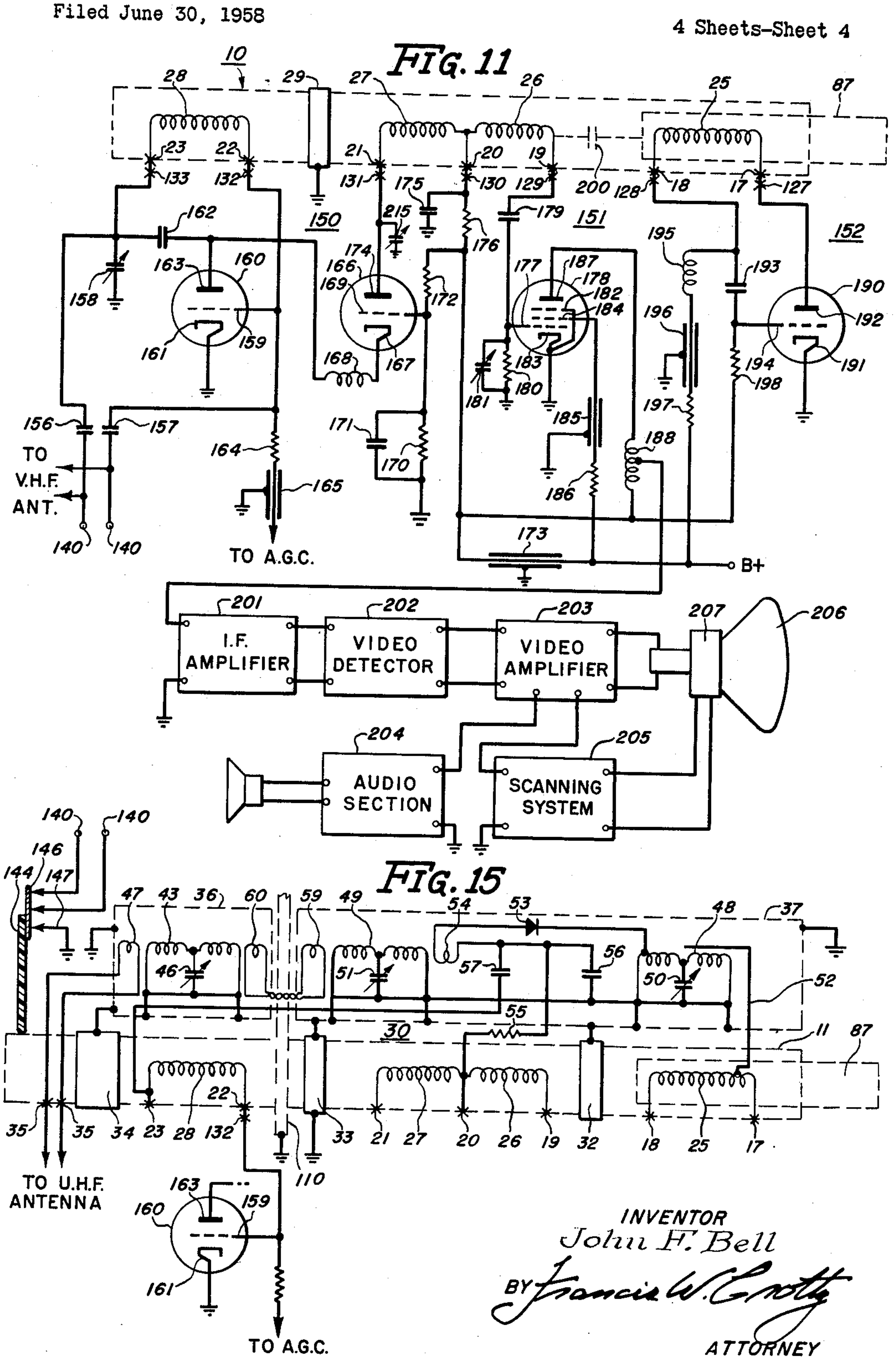

FIGURES 7, 8, 9, and 10 are views taken along section lines 7—7, 8—8, 9—9, and 10—10 respectively of FIGURE 3;

FIGURE 11 is a schematic diagram of a television receiver utilizing a tuning mechanism in accordance with the invention;

FIGURE 12 is a top view of a UHF tuning strip constructed in accordance with the invention;

FIGURE 13 is an elevational view, partly in section, of the tuning strip of FIGURE 3;

FIGURE 14 is a bottom view, partly in section, of the tuning strip of FIGURE 3 illustrating particular components of the strip; and FIGURE 15 is a schematic diagram of a UHF tuning strip.

The VHF tuning strip 10 shown in FIGURE 1 comprises a tubular or hollow core member 11 of insulating material such as steatite. The opposed extremities of core 11 include an indexing notch 15 and a clearance notch 16, respectively for indexing and mounting strip 10 in a television tuner as more fully described hereinafter.

The invention broadly contemplates a tuning strip having a multiplicity of conductive turns disposed upon core 11 and a plurality of terminals 17–23 for mechanically securing the turns to the core at a plurality of points spaced along the core. The terminals effect an electrical connection with the turns at each such point to constitute a plurality of multi-turn coils 25–28 provided with terminal connectors. The functions of coils 25–28 when in operative relation with a television tuner will be more fully discussed below.

In the disclosed embodiment of the invention terminals 17–23 comprise arcuate segments of a conductive coating, such as silver, affixed to core 11 by firing or other suitable bonding process. The segments for any one coil are positioned upon core 11 in an overlapping but peripherally offset spaced relation and are oriented with respect to one another so that they present contact surfaces which are aligned along the axis 24—24 which bisects indexing notch 15. Further, a grounding contact comprising a ring 29 of conductive material is disposed upon core 11 between coils 27, 28.

Although the conductor turns disposed upon tuning strip 10 are shown as a plurality of individual coils 25–28, the invention contemplates fabricating such coils from a continuous conductor coated with an insulating material such as polyurethane. A method for constructing a tuning strip of the type herein considered is described in pending application Serial No. 200,568 by John F. Bell which was filed on June 6, 1962 and assigned to the same assignee as the present invention. More specifically, in constructing the strip the series of terminal segments 17–23 are first affixed to core 11 at spaced points along its length. The conductor is then made fast at one end of the core and is thereafter wound upon core 11 in a single pass therealong to form a multiplicity of conductor turns. The coil turns may be uniformly spaced along the core but it is preferred that they be arranged in a plurality of spaced groups interposed between the terminal segments with a predetermined number of turns in each group and with the end turns of each of the groups overlaying adjacent ones of the terminal segments to be secured thereto. This arrangement of conductor turns along a core, preparatory to the formation of multi-turn coils, may be accomplished by cam-controlled winding mandrels in a manner well understood in the art. Thereafter, solder is applied to the end turns of each coil overlaying the terminal segment to dispel the insulating varnish and to concurrently effect both an electrical and mechanical connection between each of the end turns and its associated terminal. Thus, the plurality of multi-turn coils 25–28, properly terminated and mechanically secured in position on the coil form, are completed. At this juncture the several coils are series connected since they were formed of a single, continuous conductor. The excess portions of conductor interconnecting the several coils are now severed and discarded. When it is desired that a pair of coils formed upon core 11 have a mutual inductive coupling, they may be positioned close together as shown for coils 26–27 and they may share a common terminal strip, such as strip 20. This effects an obvious economy.

Although the described method contemplates that the terminals will be previously affixed to the core, it is equally within the scope of the invention to wind a continuous conductor first upon the core member in a single pass therealong to form a multiplicity of conductor turns and thereafter affix the series of terminals to the core to, in effect, arrange the conductor turns in a plurality of groups with the leading and trailing turns of each group electrically and mechanically secured to adjacent ones of the terminals. Furthermore, it is recognized that the multiplicity of conductor turns can be formed upon the core member by printed circuit techniques.

Terminal segments 17, 18 of coil 25 are oppositely oriented relative to the winding direction than terminal segments 19—20 of coil 26, that is, terminal segment 19 viewed from the left end of core 11 progresses in a counterclockwise direction from its free end to its junction with coil 26 and that is the same direction in which the coil is wound. However, with respect to segment 17 the direction from the free end to the coil is in a clockwise direction. At the same time, the direction of segment 20 from its connection with the coil to its free end is counterclockwise whereas the direction of segment 18 is clockwise. The orientation of one pair of terminals with respect to any other pair is arbitrary. It is only necessary that the terminals for an individual coil be peripherally offset upon the core and have those end portions remote from its solder connection with the coil in overlapping relation.

FIGURE 2 shows coils 26, 27 in perspective and clearly illustrates how the invention utilizes the technique of winding a tuning strip from a continuous conductor to provide a plurality of individual coils. FIGURE 2 further illustrates that in addition to providing mechanical security and an electrical connection, each pair of segments comprises an integral portion of its coil. For example, segment 19 constitutes the leading portion of the first turn of coil 26 while segment 20 constitutes the trailing portion of the last turn of coil 26. Segment 20 simultaneously comprises the leading portion of the first turn of coil 27 and segment 21 forms the trailing portion of the last turn of coil 27. The peripheral offset of the two terminal strips of each coil is apparent as is the fact that they have overlapping portions presenting sections aligned along axis 24—24.

FIGURE 3 illustrates a television tuner comprising a housing 61 having the spaced end walls 62, 63 which are slotted to receive a shaft 64 of a rotatable turret mechanism 65. Turret 65 comprises a displaceable carriage for supporting a plurality of VHF tuning strips 10. For purposes of clarity only one VHF tuning strip is shown in FIGURE 3.

Shaft 64 is radially secured within the slotted end walls by a pair of bearing plates 66, 67 which are fastened to respective end walls 62, 63. One end of shaft 64 has an undercut 68 which, in cooperation with bearing plate 67, prevents axial displacement of the shaft. The other end of shaft 64 carries a pinion 69 which mates with a driving gear 70 rotatably captivated by a tubular stud 71 staked to end wall 62.

The turret is further provided with a selector control knob 72 having a flange 73 which is keyed upon gear 70 and fastened thereto by conventional means. A fine tuning control 74, coaxially disposed with respect to selector control 72, secures one end of a nylon tuning rod 75. Rod 75 extends through and is supported by the center panel 76 of control 72 and the tubular stud 71. The end of rod 75 remote from control 74 protrudes within housing 61 and comprises a slotted driving head 77 having the chamfered portions 78, best shown in FIGURE 4. Rod 75 further includes a shoulder 79 which is normally urged against the back surface of panel 76 by a spring 81.

The provisions for mounting tuning strips upon turret 65 include a front mounting plate 82 having a plurality of internally threaded nylon bushings 83 secured adjacent its outer periphery. One end of each bushing has a cupped portion 84, see FIGURE 5, which includes an indexing tab 85. The other extremity of the bushing is mutilated to provide a series of spaced pedestals 86 shown in FIGURE 6. Each of bushings 83 is also provided with a tuning slug 87 having a driving finger 88 and comprised of a flexible spiral spring which is threadably received within bushing 83.

Figures 7, 8:
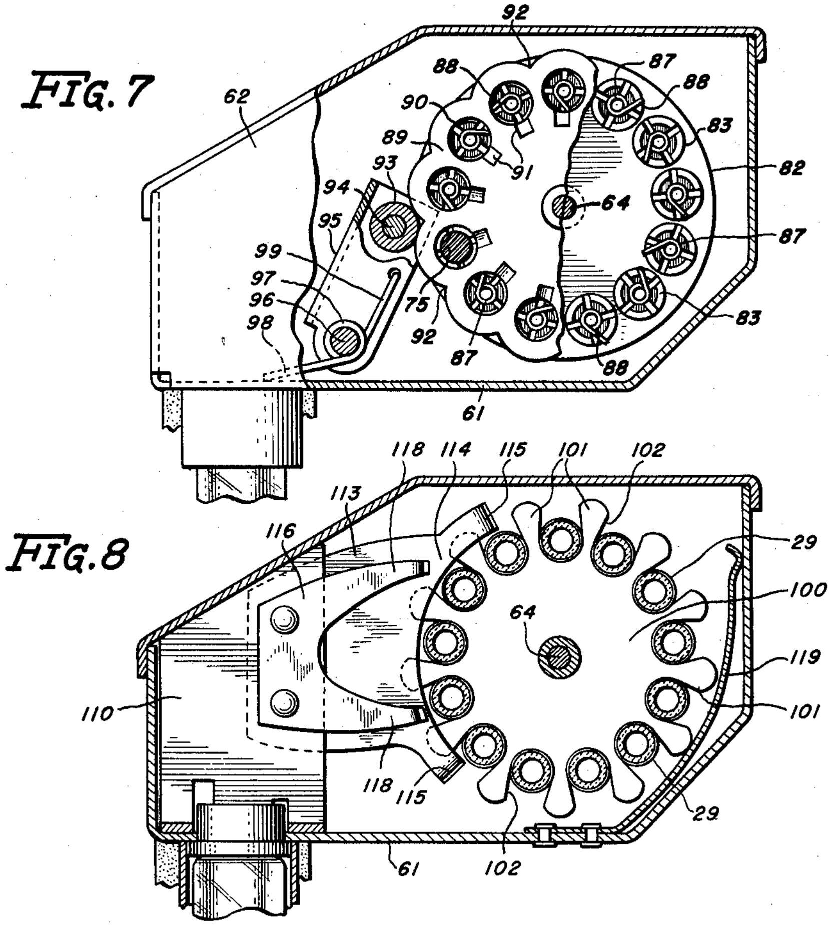

An indexing plate 89 having an array of openings 90 located near its outer periphery, see FIGURE 7, is positioned adjacent front mounting plate 82 with openings 90 in axial alignment with tuning slugs 87. An arresting ear 91, adjacent each opening 90, is upstruck from the detent plate 89. The periphery of plate 89 is scalloped to provide a series of indentations 92 engageable with a roller 93 which is journaled upon an arbor 94 supported by a detent arm 95. Arm 95 is rotatably secured by a pin 96 fastened to end wall 62. A detent spring 97 is also positioned upon pin 96 and includes a finger 98 which bears against housing 61 and further includes an extension 99 connected to detent arm 95 for urging roller 93 into engagement with indentation 92.

The turret mechanism of FIGURE 3 further includes an intermediate support plate 100 peripherally serrated to provide a plurality of posts 101 which define the U-slots 102 for supporting tuning strips and for preventing peripheral displacement thereof, as shown in FIGURE 8. Intermediate plate 100 is positioned upon shaft 64 so that the U-slots 102 are axially aligned with bushings 83 and spaced therefrom so that the grounding ring 29 of a VHF tuning strip 10 conductively contacts its associated U-slot.

Figure 9:
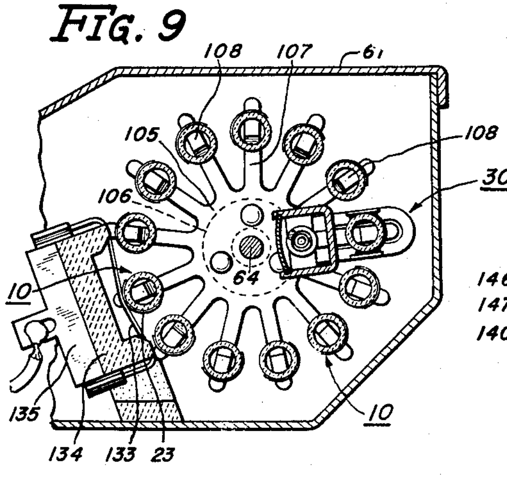

A spider member 105, profiled in FIGURE 9, is riveted to a sleeve 106 secured to shaft 64 and comprises an end mounting provision for the tuning strips. Spider 105 is comprised of a plurality of spring fingers 107 each having an offset portion 108 receivable within one extremity of hollow core member 11 for rotatably securing that end of VHF strip 10. The spider member 105 is spaced from front support plate 82 a distance such that the offset portions 108 of fingers 107 are spaced from cupped portions 84 of bushings 82 by an amount which is less than the length of core 11 thus permitting the finger offset 108 to exert inward pressure upon the tuning strips to prevent radial or axial displacement thereof.

As shown in FIGURE 3, a shield and turret grounding structure, comprising an upright conductive member 110, is disposed parallel and adjacent the intermediate plate 100 and divides the tuner into an oscillator and heterodyning section 111, and an RF input section 112. The shield structure, more clearly detailed in FIGURE 8, includes a conductive leaf 113 having an arcuate section 114 terminated by the upturned lips 115 and pinned to upright member 110. A biasing member 116 likewise pinned to member 110 is comprised of a resilient material and includes a pair of spring fingers 118 which urge arcuate section 115 into conductive engagement with the sides of adjacent ones of the posts 101 of plate 100. An auxiliary grounding spring 119 likewise comprised of a resilient material is positioned beneath plate 100 and has one end riveted to housing 61. The other end of spring 119 bears against a side wall of housing 61 to provide conductive engagement between the tops of post 101 and the spring.

The tuner further includes a stator assembly comprising spaced stationary U-shaped ribbon contacts 127–133 which are mounted upon a dielectric panel 134 and have their opposed ends secured to respective ones of the terminal lugs 135. The spacing of ribbon contacts 127–133 is identical to the spacing of conductive terminal segments 17–23, respectively, on core 11 so that the terminals of a VHF strip indexed by the detent mechanism will conductively engage corresponding stator ribbon contacts. This conductive engagement between stationary ribbon contact 133 and terminal segment 23, for example, is best shown in FIGURE 9. Lugs 135 provide conductive connection between the ribbon contacts and associated tuner circuit components. The circuit components are purposely omitted from the tuner of FIGURE 3 for purposes of clarity but are fully detailed and described hereinafter in the consideration of the schematic circuit representation of the tuner.

Although FIGURE 3 shows but a single VHF strip 10 and a UHF strip 30, a full complement of tuning strips is shown in the sectional views of FIGURES 7, 8, and 9 to illustrate a complete tuner.

Figure 10:
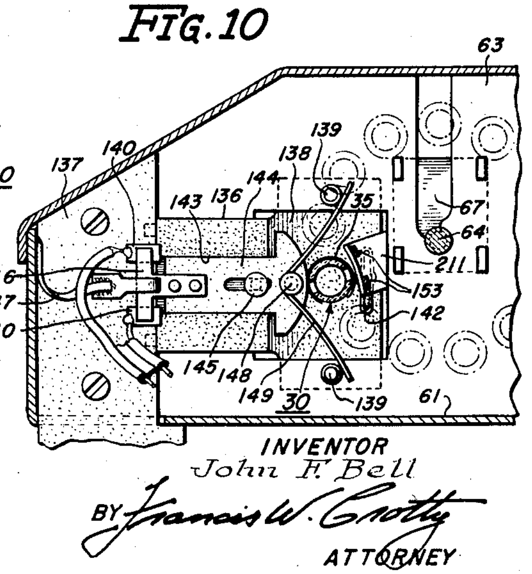

The tuner shown in FIGURE 3 additionally includes a switch for rendering a pair of antenna input circuits selectively operable and comprises a base member 136 of insulating material having a shoulder portion 137 fastened to the inner surface of end wall 63 and an offset bracket portion 138 secured to the outside surface of the end wall by the pins 139. A grounding plate 210 having a leaf 211 extending within housing 61 is conductively secured to the outside of end wall 63 by pins 139. Shoulder 137 mounts a pair of terminals 140, 140 comprising a VHF antenna input circuit while the offset bracket 138 secures another pair of antenna terminals 141, 141 having resilient contact fingers 142, 142 which extend within the tuner housing and comprise a UHF antenna input circuit. Base 136, as seen in FIGURE 10, includes a channel 143 which receives a slotted switch arm 144, likewise of an insulating material, having an arcuate driving head positioned for engagement by a switch actuator which is described below. Switch arm 144 is slideably retained in channel 143 by a shoulder rivet 145. A shorting bar 146 is fixed to one end of switch arm 144 and is grounded to housing 61 by a short conductor 147. The driving head of switch arm 144 carries a stud 148 which is biased by a return spring 149. The ends of spring 149 bear against pins 139 to urge arm 144 inwardly. In FIGURE 10 switch arm 144 is shown displaced by the UHF tuning strip 30 switch actuator, which is shown in operating relation with the tuner, causing bar 146 to short VHF antenna terminals 140, 140. However, a VHF strip 10 in operating relation does not actuate arm 144 thus permitting spring 149 to bias arm 144 inwardly to prevent bar 146 from shorting VHF antenna terminals 140, 140.

The tuner is mechanically set up for operation by mounting a series of pretuned strips upon turret 65. A VHF strip 10 is positioned upon the turret by inserting the flexible slug 87 within one end of the strip 11 and seating that end of the strip upon the cupped portion 84 of bushing 83 so that indexing tab 85 snugly engages notch 15 of the strip. The cupped bushing 83 axially restrains the strip and prevents peripheral as well as radial displacement of the strip while tab 85 and notch 15 insure that the strip is properly indexed. The strip is then pivoted downwardly until the offset portion 108 of the appropriate spider finger engages the bottom of hollow core 11 thereby radially anchoring that end and furnishing additional axial constraint of the strip. Simultaneously, an intermediate portion of strip 10 is received within the corresponding U-slot 102 of plate 100 to provide still additional peripheral restraint of the strip and to provide a positive conductive engagement between grounding ring 29 of the strip and support plate 100. It is to be noted that the use of the hollow tuning strip in conjunction with the flexible tuning slug 87 renders unnecessary any axial displacement of the strip in either mounting or demounting the strip. Of course, a like result is achieved if merely the end sections of the core are recessed or hollow but it is convenient to employ a tubular core element. The flexible tuning slug arrangement is substantially similar to that described in copending application Serial No. 745,684 by George Collins filed concurrently herewith and abandoned on August 9, 1960 in favor of application Serial No. 28,105 which was filed on May 10, 1960 and issued on January 9, 1962 as Patent 3,016,505 and which is also assigned to the same assignee as the present invention.

FIGURE 11 illustrates schematically a television tuner and the manner in which a VHF strip 10 electrically cooperates with the circuit components associated with the tuner. Basically, the television tuner comprises a cascode amplifier stage 150, a converter stage 151, and an oscillator 152.

More particularly, the VHF antenna terminals 140, 140 are coupled through capacitors 156, 157 to respective terminals 23, 22 of coil 28 which serves as an RF input coil for the cascode amplifier. Terminal 23 is coupled to reference potential through a variable tuning capacitor 158 while terminal 22 is connected to the control grid 159 of a triode amplifier 160 which comprises the input section of the cascode amplifier 150. The cathode 161 of triode 160 is connected to reference potential. A neutralizing capacitor 162 is connected between the anode 163 of tube 160 and terminal 23. Control grid 159 is returned to a source of AGC potential through a resistor 164 and the feed-through capacitor 165.

The triode 166 comprises the output section of the cascode amplifier and includes a cathode 167 which is coupled to anode 163 through an inductor 168. The control grid 169 of triode 166 is connected to reference potential through a biasing resistor 170 which is shunted by a by-pass capacitor 171. Grid 169 is also connected to a source of positive potential, indicated B+, through a voltage dropping resistor 172 and a feed-through capacitor 173. The anode 174 of tube 166 is connected to terminal 21 of RF plate coil 27 and is coupled to reference potential through a tuning capacitor 215. Terminal 20 of plate coil 27 is coupled to reference potential through the capacitor 175 and is also returned to B+ through resistor 176 and capacitor 173.

Terminal 19 of coil 26 is coupled to the control grid 177 of the converter tube 178 by capacitor 179. Grid 177 is coupled to reference potential by a biasing resistor 180 and a trimmer capacitor 181. The suppressor grid 182 of pentode 178 is directly connected to the cathode 183 which in turn is connected to reference potential. The screen grid 184 is returned to B+ through the feed-through capacitor 185 and a resistor 186 while the anode 187 of tube 178 is connected to B+ through an IF coil 188 which is pretuned to a desired intermediate frequency.

The oscillator stage 152 comprises a triode 190 having a grounded cathode electrode 191 and an anode electrode 192 connected to terminal 17 of coil 25. Terminal 18 of coil 25 is coupled through a capacitor 193 to the control grid 194 of the oscillator tube. Terminal 18 is connected to B+ via an oscillator choke coil 195, a feed-through capacitor 196 and a resistor 197, while control grid 194 is returned to B+ through the dropping resistor 198 and feed-through capacitor 173. A coupling capacitor 200, designated by a broken line configuration, represents the stray capacity contributed by the core of tuning strip 10 and the stator contact panel 134 and comprises the means whereby oscillator energy is coupled from the plate circuit of oscillator tube 190 to the grid circuit of converter tube 178. Grounding ring 29 of the tuning strip is connected to the tuner chassis to preclude coupling of oscillator energy to the VHF antenna terminals 140, 140 via RF grid coil 28. The feed-through capacitors 165, 173, 185, and 196 and their respective associated resistor elements 164, 176, 186, and 197 comprise conventional filter networks for discriminating against undesired signals appearing on the AGC and B+ supply leads.

IF coil 188 is connected to an intermediate-frequency amplifier 201 which, in turn, is coupled to a video detector 202. The video amplifier unit 203 which includes a sync separator is connected to the output of detector 202. Unit 203 is further coupled to an audio section 204, a scanning system 205, and to the intensifying electrodes of an image-reproducing device 206. The scanning system 205 is coupled to the deflection apparatus 207 of image reproducer 206. Units 201–207 constitute no part of the tuning mechanism and comprise conventional elements of a television receiver. Since they form no part of this invention, further elaboration is deemed unnecessary.

In operating a television tuner employing tuning strips constructed in accordance with the invention, the turret is rotated by selector control knob 72 to bring the strips supported thereon sequentially to a reference position, i.e., the stator contact assembly, until a strip individually selective to a pre-assigned signal frequency within the VHF band is coupled in operating relation with the VHF antenna input circuit. Specifically, this operation places the tuning strip terminal contacts 17–23 of strip 10 in conductive engagement with ribbon contacts 127–133 of the stator assembly so that inductance coils 25–28 are electrically connected to the associated circuitry of the tuner described in connection with FIGURE 11. It is first assumed, of course, that coils 26–28 of strip 10 have been wound to exhibit a frequency characteristic such that when the coils are electrically connected to the associated tuner circuits, the completed circuits resonate at the frequency of the desired channel. Oscillator coil 25 has been wound in like manner but to resonate in conjunction with its associated circuit at a frequency displaced from the resonant frequency of coils 26–28 by an amount equal to a desired intermediate frequency.

Referring again to the schematic representation of FIGURE 11, the desired signal having been intercepted by the antenna, it is coupled from antenna terminals 140, 140 to the input section of cascode amplifier 150 through capacitors 156, 157. RF coil 28 in conjunction with tuning capacitor 158, and, to a lesser extent, the grid-cathode interelectrode capacity of tube 160, selectively tune the grid circuit of tube 160 to the desired channel while rejecting all other signals. An amplified replica of the desired signal is developed across inductor 168 in the output circuit of tube 160 and is coupled to cathode 167 of tube 166 for additional amplification by triode 166. Coil 27 and capacitor 215 comprise a tuned plate impedance for tube 166 and provide additional selectivity for the desired signal. The desired signal thus amplified is coupled from coil 27 to coil 26 for application to grid 177 of converter tube 178. Simultaneously, oscillator energy from coil 25 is coupled to converter grid coil 26 through the stray capacity 200. Thus supplied with a pair of signals, pentode 178 performs a conventional mixing function and develops a signal of intermediate frequency across IF coil 188. The IF signal is thereafter coupled to IF amplifier 201 and is subsequently detected by video detector 202 to provide the appropriate signals for operating units 202–207 of the receiver.

If it is determined during operation that the desired channel is not properly tuned, fine tuner control 74 is depressed to engage tuning rod 75 with driving finger 88 of the tuning slug 87 associated with the strip. The tuning rod is then rotatably driven to insert or withdraw the slug from oscillator coil 25 until a proper response is visually and aurally determined. Upon releasing tuning control 74, spring 81 returns the control and rod 75 to their normal positions.

The particular construction of the tuning rod driving head and bushing 83 insures that the tuning slug cannot be driven beyond a point from which it can be retrieved. That is to say, as slug 87 is driven inwardly, finger 88 will be intercepted by one of the nylon pedestals 86. Should finger 88 be driven over one of the pedestals, a subsequent pedestal will arrest inward progression of the slug. Furthermore, upon continued rotation of tuning control 74 the clutch action of chamfered portion 78 will disengage the driving head of rod 75 from finger 88 to preclude binding. When tuning control 74 is rotated in the opposite direction, the abrupt walls of the slotted driving head effect a positive engagement with finger 88 and retract the slug. Outward displacement of the tuning slug is limited by ear 91 on indexing plate 89 which arrests finger 88 to prevent removal of the slug from its bushing.

The tuning mechanism, like all turret tuners, lends itself readily to UHF reception by the use of UHF tuning strips. The UHF tuning strip 30 is shown in FIGURES 12, 13, and 14. It utilizes a core 12 of a configuration similar to core 11 of VHF strip 10 except with respect to length. Core member 12 includes a like plurality of terminal segments 17–23 and, with the exception of segment 23, maintains the identical space relation as corresponding numbered terminals on core 11. Core 12 likewise includes an indexing notch 15 but employs a clearance slot 31 at one extremity in place of a notch for securing the core upon the turret mechanism. This extremity additionally comprises a switch actuator for cooperating with the antenna switching arrangement previously detailed in the description of the tuner proper.

UHF strip 30 is likewise provided with a plurality of multi-turn coils 25–28 which are formed in the same manner as the coils for VHF strip 10. Core 12 further includes a circumferentially disposed mounting ring 32 and the grounding rings 33, 34 and a pair of antenna input terminals 35, 35 disposed upon opposite sides of that extremity of core 12 which comprises the switch actuator.

The UHF tuning strip 30 further includes an UHF preselector comprising a pair of conductive sub-chassis 36, 37 which straddle core 12 in an overlaying relation and electrically shield the coils on core 12 from the preselector. More particularly, chassis 36 includes an apertured tongue 38 which secures the chassis to core 12 and which, in cooperation with slot 31 of the core, comprises means for mounting one end of tuning strip 30 upon a turret. A pair of arms 39 electrically connect one end of chassis 36 to grounding ring 34 while the mounting legs 40, 40 straddle core 12 to support the opposite end of chassis 36. Chassis 37 is supported on core 12 by the pairs of mounting legs 41, 41 and 42, 42 which are soldered to conductive rings 32, 33 respectively. Chassis 36 and 37 each include respective grounding tabs 153, 153, and 154, 154, the latter comprising a portion of the chassis cover 155.

Included within chassis 36 and 37 are the preselector frequency determining elements, best shown in FIGURE 14. Chassis 36 supports an antenna coil 43 having its opposite ends connected to the chassis and having its midpoint connected to a metallized dielectric rod 44 which in conjunction with the threaded bushing 45 connected to chassis 36 comprises an adjustable coaxial type tuning capacitor 46. An antenna coupling loop 47 is positioned adjacent one end of coil 43 and has its terminals connected to antenna contacts 35, 35.

Chassis 37 comprises a multiplier coil 48 and a mixer coil 49 which are of a similar construction as antenna coil 43 and have their opposed ends terminated upon chassis 37. Coils 48, 49 have their respective midpoints coupled to chassis 37 through the capacitors 50, 51 comprised of similar metallized dielectric rods 44 and threaded bushings 45. A conductive lead 52 which comprises a coupling arrangement has one end connected to strip coil 25 and its other end disposed adjacent multiplier coil 48. A mixer crystal 53 has one terminal connected to multiplier coil 48 while its other terminal is returned to terminal 20 on core 12 through a mixer coupling loop 54 and a mixer biasing resistor 55, FIGURE 13. The juncture of loop 54 and resistor 55 is coupled to chassis 37 through a wafer-type RF by-pass condenser 56 and is also coupled to segment 23 through a second wafer capacitor 57 and the insulated conductor 58. An inter-circuit coupling network is provided and comprises the loops 59, 60 for inductively coupling mixer coil 49 to antenna coil 43.

The tuner is mechanically conditioned for operation in the UHF band by mounting an appropriate UHF strip upon turret 65. The UHF strip is mounted upon the turret in a manner similar to the VHF strips with bushing 83 preventing peripheral and radial displacement of one end of the strip while the other extremity is secured through the cooperative engagement of the offset portion 108 of spider finger 107 and clearance slot 31 of the core. Peripheral restraint of this end of the UHF strip is furnished solely by the appropriate U-slot 102 of plate 100 which also effects a conductive contact with grounding ring 33 of the UHF strip.

FIGURE 15 comprises a schematic illustration of the preselector elements of UHF tuning strip 30 previously described in connection with FIGURES 12–14. The coils 25–28 of the UHF strip cooperate with the amplifier and heterodyning portions of the tuner circuitry in substantially the same manner as coils 25–28 of a VHF strip although several distinctions are apparent. For example, RF grid coil terminal 23 is coupled to the UHF mixer circuit via capacitor 57 instead of to an antenna input circuit and a mixer biasing resistor 55 is connected to strip terminal 20 while oscillator coil 25 is capacity coupled to the multiplier coil 48 by the proximity of lead 52. FIGURE 15 also reveals, schematically, the electrical counterpart of switch arm 144 which is shown displaced by the switch operator end of core 12 to short the VHF antenna input circuit terminals 140, 140 during UHF operation.

Reception of an UHF station is initiated by rotating selector control knob 72 to bring the turret supported strips sequentially to the reference position until a strip individually selective to a pre-assigned UHF frequency is in operating relation with the UHF antenna input circuit. Terminals 17–22 of strip 30 are then conductively engaged by ribbon contacts 127–132 of the stator contact assembly while strip terminals 35, 35 engage the stationary UHF contact fingers 142, 142, only one shown in FIGURE 10. It is to be noted however, that during UHF operation ribbon contact 133 does not engage terminal 23 of the UHF strip but is connected to grounding ring 34. It is assumed in this instance that antenna coil 43 and its tuning capacitor 46 have been pretuned to the desired UHF channel, and that mixer coil 49 and capacitor 51 are likewise pretuned to provide additional selectivity for the desired signal. The multiplier circuit comprised of coil 48 and capacitor 50 is pretuned to a frequency which is displaced from the desired UHF signal by a frequency equal to a predetermined IF frequency. This in turn requires that coil 25 be so wound upon core 12 as to furnish a reactive component that activates oscillator 190 at a particular fundamental frequency. The resonant frequency of the multiplier circuit is then a selected harmonic of this fundamental frequency. The other coils 26–28 on core 12 have been wound to furnish a frequency characteristic such that when the coils are electrically connected to the associated tuner circuit, the completed circuits will resonate at the aforementioned predetermined IF frequency.

When the UHF strip 30 registers with the stator contact assembly, as shown in FIGURE 10, that extremity of strip 30 comprising a switch actuator displaces switch arm 144 to disable the VHF antenna input circuit by shorting terminals 140, 140. FIGURE 10 also shows the manner in which tabs 153 of preselector chassis 36 coperate with grounding leaf 211. The electrical operation attendant upon UHF reception is depicted in the schematic representation of FIGURE 15.

A desired UHF signal is coupled from the antenna to the pretuned antenna coil 43 which is connected to terminals 35, 35. The received signal is then coupled to mixer coil 49 through coupling loops 60, 59. The oscillator tube 190, not shown in FIGURE 15, has its resonant activity determined by coil 25 and furnishes oscillator energy to multiplier coil 48 through lead 52. The multiplier coil abstracts a particular harmonic of oscillator 190 which is frequency spaced from the received UHF signal by a predetermined IF frequency. The harmonic signal selected by multiplier coil 48 is coupled to one terminal of mixer crystal 53 while loop 54 couples received signal energy from mixer coil 49 to the other terminal of crystal 53. Conventional mixer action by crystal 53 provides an IF signal of the desired predetermined frequecy, which signal is coupled to grid coil 28 through capacitor 57 for amplification by triode 160.

Although only triode 160 of the television tuner is shown in operative relation with the UHF tuning strip, it is to be understood that the IF signal is subsequently amplified by the cascode amplifier 150 in the same manner as VHF signal amplification discussed in relation to FIGURE 11. A notable distinction during UHF operation, however, is that the IF signal furnished by mixer crystal 53 amplified by cascode amplifier 150 is further amplified by pentode 178 which, during reception of UHF signals, does not function as a mixer but as a conventional amplifier. The IF signal thus amplified develops a voltage across IF coil 188. As in VHF operation, the IF signal is then coupled to IF amplifier 201 for subsequent utilization by the television receiver.

In the above discussion of a turret tuner it has been demonstrated that while the inductive reactances for the various tuned circuits are primarily determined by the tuning strip coils, the capacitive reactances are furnished by a combination of tube electrode capacity, conventional capacitor elements, and stray capacity. The conductive paths linking a particular coil to its associated capacitor element includes the strip terminals, the stator contacts, and connecting leads. This path constitutes an inductance component and any change in the length of this conductive path will provide an incremental change in the inductance of the associated tuned circuit. There is no problem of course, so long as the conductive path length remains constant. The only parameters capable of altering this path length are the contacts since if the point of engagement between the strip terminals and the stator contacts changes, a corresponding change in the length of the conductor path occurs. It is thus imperative that upon registration of a tuning strip with its stator contact, the contact impedance attributable to this electrical connection remain substantially constant.

In conventional turret tuners inaccurate registration of the tuning strip terminals with the stator contacts results in a change in the length of conductive path between the strip and associated circuit since there is no provision for compensating variances in conductive path length.

This shortcoming of prior art devices is precluded by the tuning strip terminal arrangement utilized with tuning strips constructed in accordance with the invention. Specifically, the arrangement of terminal segments 17–23 on core 11 insures a constant contact impedance and this is readily demonstrable. For example, if core 11 is rotated upon its turret mounts to simulate improper indexing or inaccurate registration, the length of terminal segment 17 between its solder joint with coil 25 and the point at which the terminal engages ribbon contact 27 is reduced. However, an equal increment of terminal segment 18 is added between the coil's solder joint on terminal 18 and the point of contact between terminal 18 and ribbon contact 128. Thus the length of conductive segment material in series with coil 25 remains constant and precludes detuning of circuitry coupled thereto. This result is realized because of the overlapping spaced relation of terminal segments 17–23 along core 11. The contact surfaces of terminals 17–23 presented to stator contacts 127–133 are so oriented along axis 24—24 of the core that upon rotation of the core a diminishing of conductive length of one of the terminals of a coil is compensated by a corresponding lengthening of the coil's other terminal strip.

The subject invention thus provides a novel tuning strip having a plurality of multi-turn coils formed upon a core of insulating material by a single winding operation from a continuous conductor and a method for accomplishing the same. The strip further includes a novel coil terminating arrangement comprising a plurality of conductive terminal segments disposed upon the core in such a manner as to provide a constant contact impedance to the tuned circuits associated with the several coils. Furthermore, since the core serves as a support for the coils as well as the coil terminals, a substantial economic advantage is realized over the prior art units.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A tuning strip for a turret tuner comprising: an elongated core member of insulating material; a multiplicity of turns of a conductor wound over said member; a plurality of terminals mechanically securing said conductor to said member at a plurality of points spaced along said member and effecting at each such point an electrical connection with said conductor to constitute therewith a plurality of multi-turn coils individually provided with terminal connectors; the aforesaid terminal connections of each of said coils comprising a pair of conductive segments affixed to said core member in overlapping but peripherally offset spaced relation and all of said terminal connections being oriented with respect to one another to present contact surfaces in axial alignment along said core member; said core having provisions at one end for rotatably securing said strip to a turret and having provisions at the opposite end for securing said strip to said turret and for indexing said core to establish a predetermined presentation of said contact surfaces of said terminals.

2. A tuning strip for a turret tuner comprising: an elongated core member of insulating material; a multiplicity of turns of a conductor wound over said member; a plurality of terminals mechanically securing said conductor to said member at a plurality of points spaced along said member and effecting at each such point an electrical connection with said conductor to constitute therewith a plurality of multi-turn coils individually provided with terminal connectors; and two of said terminals, forming the terminal connections of one of said coils, comprising a pair of conductive segments affixed to said core member in overlapping but peripherally offset spaced relation and connected to said coil so that one such segment constitutes the leading portion of the first turn of said coil while the other segment constitutes the railing portion of the last turn of said coil.

3. A tuning strip for a turret tuner comprising: an elongated core member of insulating material having provisions at the opposed ends thereof for mounting said strip upon a turret; a multiplicity of turns of a conductor wound over said member; a plurality of terminals mechanically securing said conductor to said member at a plurality of points spaced along said member and effecting at each such point an electrical connection with said conductor to constitute therewith a plurality of multi-turn coils individually provided with terminal connectors; two of said terminals, forming the terminal connections of one of said coils, comprising a pair of segments of a conductive coating affixed to said core member in overlapping but peripherally offset spaced relation and connected to said coil so that one such segment constitutes the leading portion of the first turn of said coil while the other segment constitutes the trailing portion of the last turn of said coil.

4. A tuning strip for a turret tuner comprising: an elongated core member of insulating material having provisions at the opposed ends thereof for mounting said strip upon a turret; a multiplicity of turns of a conductor wound over said member; a plurality of terminals mechanically securing said conductor to said member at a plurality of points spaced along said member and effecting at each such point an electrical connection with said conductor to constitute therewith a plurality of multi-turn coils individually provided with terminal connectors; two of said terminals, forming the terminal connections of one of said coils, comprising a pair of conductive segments affixed to said core member in overlapping but peripherally offset spaced relation and joined to said coil by solder connections so that one such segment constitutes the leading portion of the first turn of said coil while the other segment constitutes the trailing poriton of the last turn of said coil.

5. A tuning mechanism for selectively accepting wave signals comprising: a rotatable turret; a plurality of stationary contacts disposed adjacent said turret; a tuning strip comprising an elongated core member of insulating material; a multiplicity of turns of a conductor wound over said member, a plurality of terminals mechanically securing said conductor to said member at a plurality of points spaced along said member and effecting at each such point an electrical connection with said conductor to constitute therewith a plurality of multi-turn coils individually provided with terminal connectors for engaging said contacts, two of said terminals, forming the terminal connections of one of said coils, comprising a pair of conductive segments affixed to said core member in overlapping but peripherally offset spaced relation and connected to said coil so that one segment constitutes the leading portion of the first turn of said coil while the other segment constitutes the trailing portion of the last turn of said coil, said segments being oriented with respect to one another to present median contact surfaces thereof in axial alignment along said core; and said core having provisions at the opposite ends thereof for securing said strip to said turret and for indexing said core to establish a predetermined presentation of said contact surfaces to said stationary contacts.

6. A UHF tuning strip for a turret tuner comprising: an elongated core member of insulating material having provisions at the opposed ends thereof for mounting said strip upon a turret; a multiplicity of turns of a conductor wound over said member; a plurality of terminals mechanically securing said conductor to said member at a plurality of points spaced along said member and effecting at each such point an electrical connection with said conductor to constitute therewith a plurality of multi-turn coils individually provided with terminal connectors, selected ones of said coils being tuned to a predetermined intermediate frequency; a sub-chassis supported by said strip in overlaying relation with respect to but electrically shielded from said coils, said sub-chassis including an input selector responsive to a predetermined signal in the UHF band, a heterodyne signal supply means, a mixer and an output circuit for said mixer tuned to said predetermined intermediate frequency; and a coupling extending from said output circuit to one of said tuned coils.

7. A tuning strip for a turret tuner comprising: an elongated core member of insulating material having provisions at the opposed ends thereof for mounting said strip upon a turret; a coating of conductive material bonded to said member and defining a plurality of groups of conductor turns; a series of terminals comprised of segments of conductive material bonded to said member and said coating at spaced points therealong and effecting at each such point an electrical connection with end turns of said groups to constitute a corresponding plurality of multi-turn coils provided with terminal connectors.

8. A tuning strip for a turret tuner having stationary contacts comprising: an elongated core member having insulated portions and a plurality of conductive areas interposed therebetween along the length of said core member and affixed thereto to constitute terminal portions for effecting wiping engagement with said stationary contacts and further having provisions at the opposite ends thereof for mounting said strip upon a turret; a multiplicity of turns of an insulated conductor coiled about said core member with a conductor turn overlapping each of said conductive terminal portions thereof; and a plurality of bonding connections mechanically securing each of said terminal portions of said core member to the conductor turn in overlapping relation therewith and effecting an electrical connection between each such terminal portion and its overlapping conductor turn to form to said core member a plurality of multi-turn coils provided with terminal connectors.

9. A tuning strip for a turret tuner having stationary contacts comprising: an elongated core member having insulated portions and a plurality of arcuate conductive areas interposed therebetween along the length of said core member and affixed thereto to constitute terminal portions for effecting wiping engagement with said stationary contacts and further having provisions at the opposite ends thereof for mounting said strip upon a turret; a multiplicity of turns of a single insulated conductor coiled about said core member with a conductor turn overlapping each of said conductive terminal portions thereof; and a plurality of bonding connections mechanically securing each of said arcuate terminal portions of said core member to the conductor turn in overlapping relation therewith and effecting an electrical connection between each such terminal portion and its overlapping conductor turn to form on said core member a plurality of discrete multi-turn coils provided with terminal connectors.

10. A tuning strip for a turret tuner having stationary contacts comprising: an elongated core member having insulated portions and a plurality of arcuate conductive areas interposed therebetween along a length of said core member and affixed thereto to constitute terminal portions for effecting wiping engagement with said stationary contacts, further having provisions at one end thereof for mounting said strip upon the turret and having provisions at the other end for indexing said strip upon the turret; a multiplicity of turns of an insulated conductor coiled about said core member with a conductor turn overlapping each of said conductive terminal portions thereof; and a plurality of bonding connections mechanically securing one end of each of said terminal portions of said core to the conductor turn in overlapping relation therewith and effecting an electrical connection between each such terminal portion end and its overlapping conductor turn to form on said core member a plurality of multi-turn coils provided with terminal connectors, said terminal portions being oriented with respect to one another to present the contact surfaces thereof remote from said bonded ends in axial alignment along said core so that said core indexing provision establishes a predetermined presentation of said contact surfaces when said strip is mounted upon the turret.

References Cited in the file of this patent

UNITED STATES PATENTS

| | | |
|---|---|---|
| 2,054,424 | Johnson | Sept. 15, 1936 |
| 2,360,835 | Kongsted et al. | Oct. 24, 1944 |
| 2,404,185 | Mann | July 16, 1946 |
| 2,501,591 | Bach | Mar. 21, 1950 |
| 2,580,895 | DeTar | Jan. 1, 1952 |
| 2,596,117 | Bell et al. | May 13, 1952 |
| 2,657,365 | Lazzery | Oct. 27, 1953 |
| 2,706,252 | Overman | Apr. 12, 1955 |
| 2,730,682 | Wood | Jan. 10, 1956 |
| 2,739,371 | Grisdale et al. | Mar. 27, 1956 |
| 2,826,687 | Fisher | Mar. 11, 1958 |
| 2,851,593 | Machlin | Sept. 9, 1958 |
| 2,868,982 | Carlson | Jan. 13, 1959 |
| 3,000,079 | Howell et al. | Sept. 19, 1961 |

FOREIGN PATENTS

| | | |
|---|---|---|
| 402,081 | Great Britain | Nov. 20, 1933 |
| 610,800 | Great Britain | Oct. 20, 1948 |
| 468,423 | Canada | Sept. 26, 1950 |